US008796548B2

(12) United States Patent
Rost et al.

(10) Patent No.: US 8,796,548 B2
(45) Date of Patent: Aug. 5, 2014

(54) UNDERGROUND UTILITY BOX ASSEMBLY

(75) Inventors: Kevin L. Rost, Oak Glen, CA (US);
Hardy L. Rost, Cookville, TN (US)

(73) Assignee: Seahorse Industries Ltd., Las Vegas, NV (US)

( * ) Notice: Subject to any disclaimer, the term of this patent is extended or adjusted under 35 U.S.C. 154(b) by 159 days.

(21) Appl. No.: 13/488,253

(22) Filed: Jun. 4, 2012

(65) Prior Publication Data

US 2013/0319716 A1    Dec. 5, 2013

(51) Int. Cl.
*H02G 3/08* (2006.01)
*H02G 3/14* (2006.01)

(52) U.S. Cl.
USPC .......................... 174/50; 174/50.5; 174/50.51

(58) Field of Classification Search
CPC ....... H02G 3/081; H02G 3/086; H02G 3/088; H02G 3/14
USPC ........... 174/50, 50.5, 53, 57, 58, 17 R, 17 CT, 174/520, 559, 564, 50.51; 220/3.2–3.9, 220/4.02
See application file for complete search history.

(56) References Cited

U.S. PATENT DOCUMENTS

| | | | |
|---|---|---|---|
| 4,265,365 A | | 5/1981 | Boteler |
| 4,620,061 A | * | 10/1986 | Appleton ........................ 174/51 |
| 5,574,254 A | * | 11/1996 | Mori et al. ..................... 174/561 |
| 6,577,817 B2 | * | 6/2003 | Harris ........................... 392/481 |
| 7,376,325 B1 | * | 5/2008 | Cloud et al. ................... 385/135 |
| 8,101,859 B2 | * | 1/2012 | Zadesky .......................... 174/50 |

FOREIGN PATENT DOCUMENTS

| | | |
|---|---|---|
| EP | 2164143 | 3/2010 |
| JP | 0739043 | 2/1995 |
| WO | WO 96/37938 | 11/1996 |

OTHER PUBLICATIONS

International Search Report on corresponding PCT application (PCT/US2013/043729) from International Searching Authority (KIPO) dated Aug. 27, 2013.
Written Opinion on corresponding PCT application (PCT/US2013/043729) from International Searching Authority (KIPO) dated Aug. 27, 2013.

* cited by examiner

*Primary Examiner* — Chau N Nguyen
*Assistant Examiner* — Paul McGee, III
(74) *Attorney, Agent, or Firm* — Klein, O'Neill & Singh, LLP

(57) ABSTRACT

A utility box assembly includes a housing structure having an open upper end, a first peripheral channel around the open upper end, and a second peripheral channel disposed below the first peripheral channel and inwardly therefrom. A first sealing element is seated in the first peripheral channel, and a second sealing element is seated in the second peripheral channel. A cover is configured to cover the open upper end. The cover has an outer peripheral portion configured to engage the first sealing element, and a downward-depending flange configured to engage the second sealing element. A liquid-tight seal is provided by the compression of the first and second sealing elements within their channels when the cover is secured to the open upper end of the housing.

8 Claims, 4 Drawing Sheets

# UNDERGROUND UTILITY BOX ASSEMBLY

CROSS-REFERENCE TO RELATED APPLICATIONS

Not Applicable

FEDERALLY SPONSORED RESEARCH OR DEVELOPMENT

Not Applicable

BACKGROUND

The present disclosure relates to underground utility boxes and receptacles (sometimes called "vaults"), such as those used in cable TV systems, telephone systems, electric utilities, and water utilities (such as, for example, irrigation systems). More specifically, it relates to a utility box assembly for use with an underground utility box or receptacle. Hereinafter, the term "utility box" will be used for simplicity, without limitation to the shape or configuration of the receptacle.

A typical underground utility box is placed within a hole in the ground so that only the top cover of the box is exposed. The utility box may contain a variety of different devices and instruments. For example, in a water utility application, the utility box may contain one or more valves and/or flow meters.

Many devices housed within an underground utility box are sensitive to water. Therefore, it is advantageous that the utility box resist water penetration. Further, a sealed utility box resists entry by rodents that may gnaw on electrical wiring within the box, and spiders, snakes and bees that may present a danger to workers who open the box. Moreover, sealing against dirt, dust, and debris may also advantageously enhance reliability and reduce maintenance costs.

SUMMARY

The various embodiments of the present utility box assembly have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide the advantages described herein.

One embodiment of the utility box assembly comprises a housing having an open upper end, a first peripheral channel around the open upper end, and a second peripheral channel disposed below the first peripheral channel and inwardly therefrom; a first sealing element seated in the first peripheral channel; a second sealing element seated in the second peripheral channel; and a cover configured to cover the open upper end. The cover has an outer peripheral portion configured to engage the first sealing element and a downward-depending flange configured to engage the second sealing element. A liquid-tight seal is provided by the engagement of the first and second sealing elements between the cover and the housing.

BRIEF DESCRIPTION OF THE DRAWINGS

The various embodiments of the present sealing cover assembly will be discussed in detail with an emphasis on highlighting the advantageous features. These embodiments are depicted in the accompanying drawings, which are for illustrative purposes only. These drawings include the following figures. in which like numerals indicate like parts.

DETAILED DESCRIPTION

Figure 1:
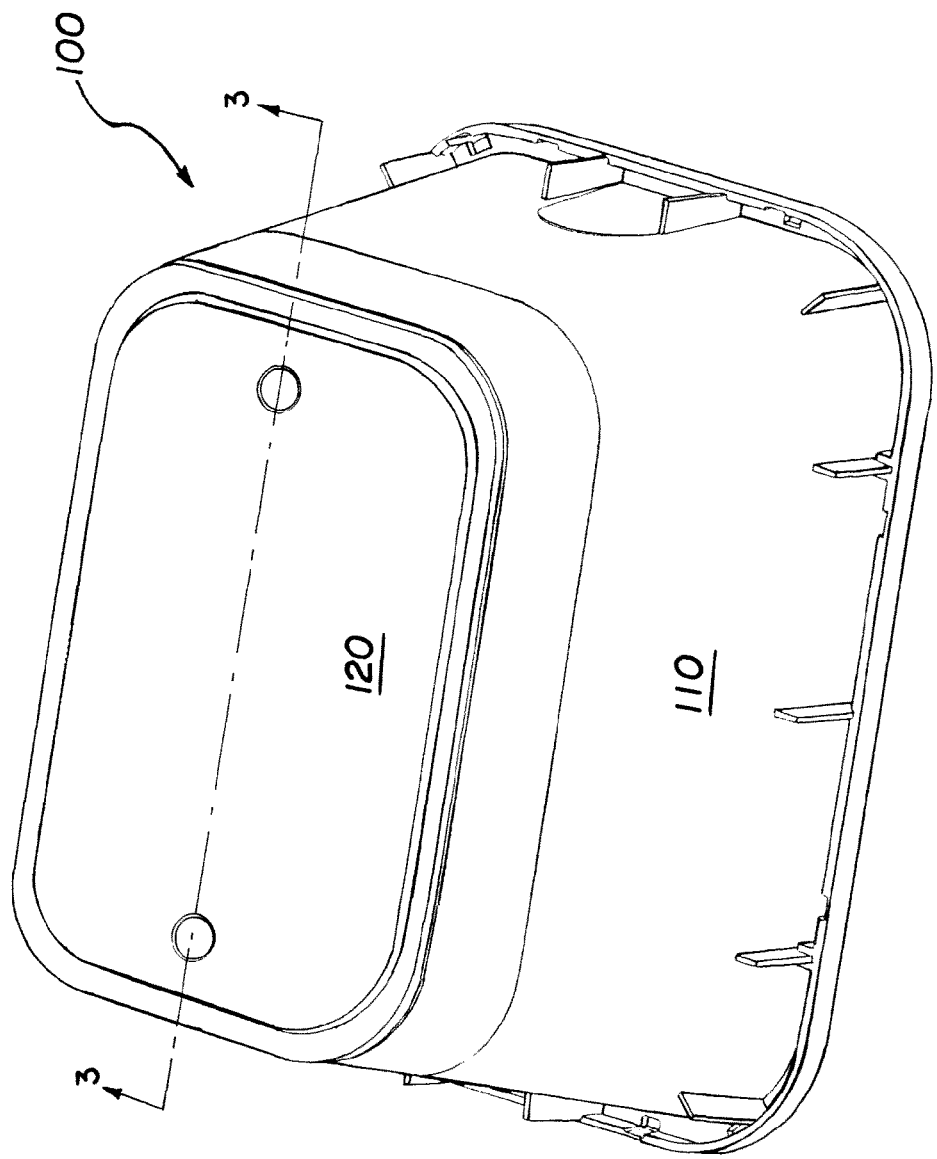
FIG. 1 is a top perspective view of an underground utility box in accordance with an embodiment of the present disclosure.
Figure 2:
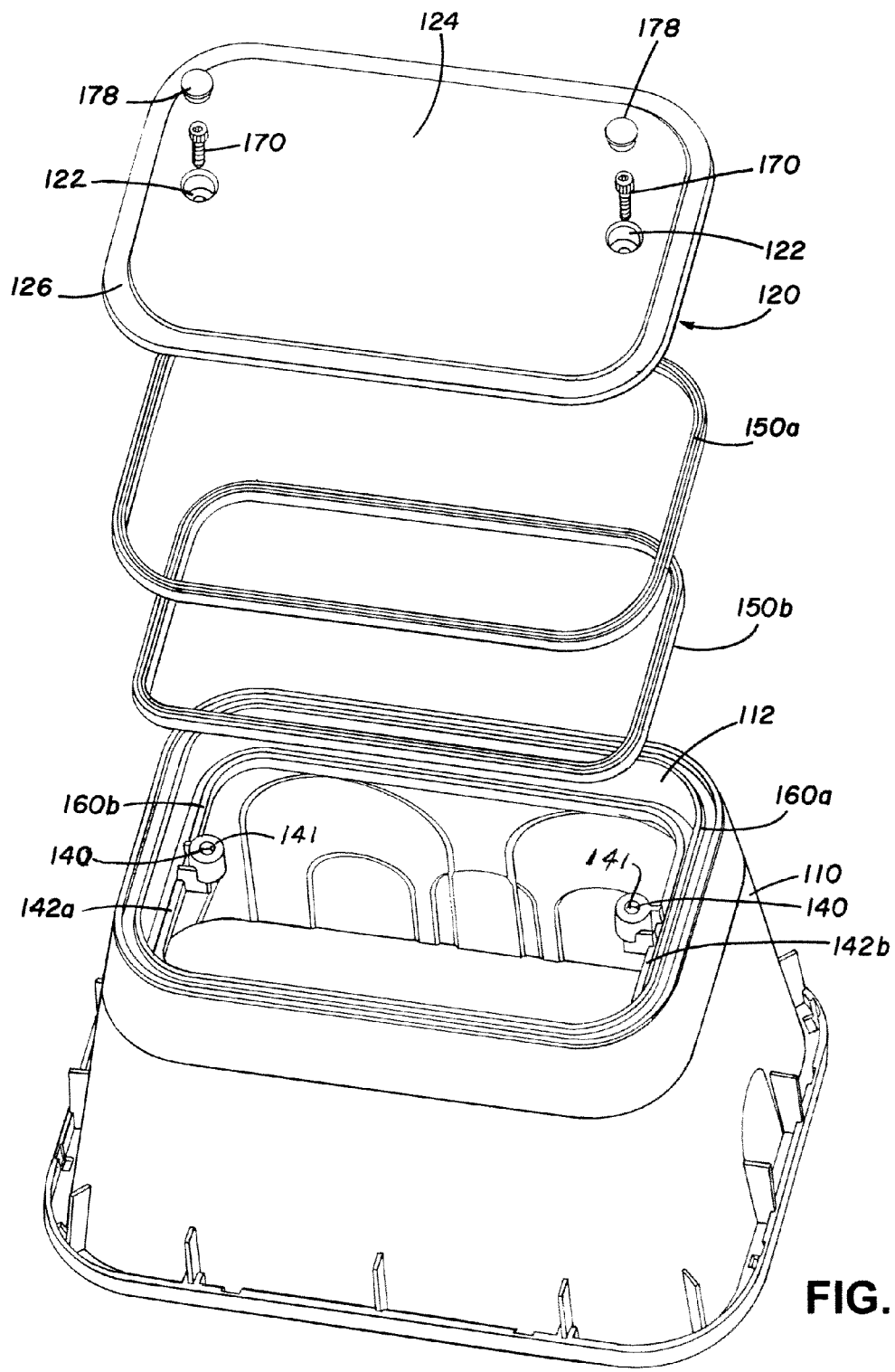
FIG. 2 is an exploded front perspective view underground utility box in accordance with an embodiment of the present disclosure.

FIGS. 1-4 illustrate an embodiment of the present utility box assembly 100. FIG. 2 illustrates components of the utility box assembly 100 exploded for clarity. The illustrated embodiment includes a housing structure 110, a top cover 120, and at least first and second peripheral sealing elements or gaskets 150a, 150b, respectively, sandwiched between the housing structure 110 and the cover 120, as will be described in detail below. In many applications, a bottom cover (not shown) may be installed on the bottom of the housing structure 110.

The sealing elements or gaskets 150a, 150b may be made of any suitable material that is resilient and elastomeric, such as, for example, ethylene propylene diene monomer (EPDM) rubber, fluoropolymer elastomers (such as that marketed by DuPont Performance Elastomers under the mark VITON®), Buna N (nitrile) rubber (copolymer of butadiene and acrylonitrile) or neoprene, with Buna N rubber being preferred.

In the illustrated embodiment, the housing structure 110 is hollow and substantially trapezoidal in shape with rounded corners, but this configuration is only one example and not limiting. The housing structure 110 is open at the bottom and has an open upper end 112, and it advantageously includes first and second peripheral seating channels 160a, 160b around the open upper end 112. The first and second seating channels 160a, 160b are configured to receive the first and second sealing elements or gaskets 150a, 150b, respectively. In a preferred embodiment, the first seating channel 160a is provided in a top surface of a vertical rim 114 peripherally surrounding the open upper end 112 of the housing structure 110, and the second seating channel 160b is provided in a peripheral shoulder 116 extending inwardly from the interior wall surfaces of the housing structure 110. The shoulder 116 is positioned below the first seating channel 160a and inwardly therefrom, and thus the second seating channel 160b is likewise positioned relative to the first seating channel 160a. Again, although the illustrative embodiment shows the utility box assembly includes two seating channels 160a, 160b and two sealing elements or gaskets 150a. 150b, it will be appreciated that the number and configuration of the seating channels 160a, 160b and sealing elements or gaskets 150a, 150b are exemplary only and not limiting.

The housing structure 110 further includes at least first and second fastener receptacles 140, which are positioned on interior walls of the housing structure. Each of the fastener receptacles 140 is in the shape of a hollow cylinder having an interior bore 141 that is perpendicular to a plane defined by the cover 120 when the cover 120 is installed on the housing structure 110. Each of the fastener receptacle bores 141 is configured to receive a threaded fastening member or fastener 170, which may be a screw or bolt, for example, for securing the cover 120 to the housing structure 110. Preferably, the first and second fastener receptacles 140 are respectively fixed to opposite interior housing walls 142a, 142b, as best shown in FIG. 2. In some embodiments, additional fastener receptacles (not shown) may be provided on the two remaining interior walls.

The cover 120 is substantially rectangular in shape and of a size corresponding to the open upper end 112 of the housing structure 110. The cover 120 includes at least first and second cover apertures 122. The cover apertures 122 are located in the cover 120 so as to be in registry with the bores 141 of the fastener receptacles 140 when the cover 120 is installed on the open upper end 112 of the housing structure 110. Thus, when the cover 120 is installed, the registration of each of the cover apertures 122 with its respective fastener receptacle bore 141 allows one of the fastening members 170 to be installed through each registered aperture/bore pair. If the housing structure 110 includes additional fastener receptacles, as noted above, the cover 120 will have additional cover apertures (not shown) corresponding to, and in registry with, the additional fastener receptacles.

Figure 3:
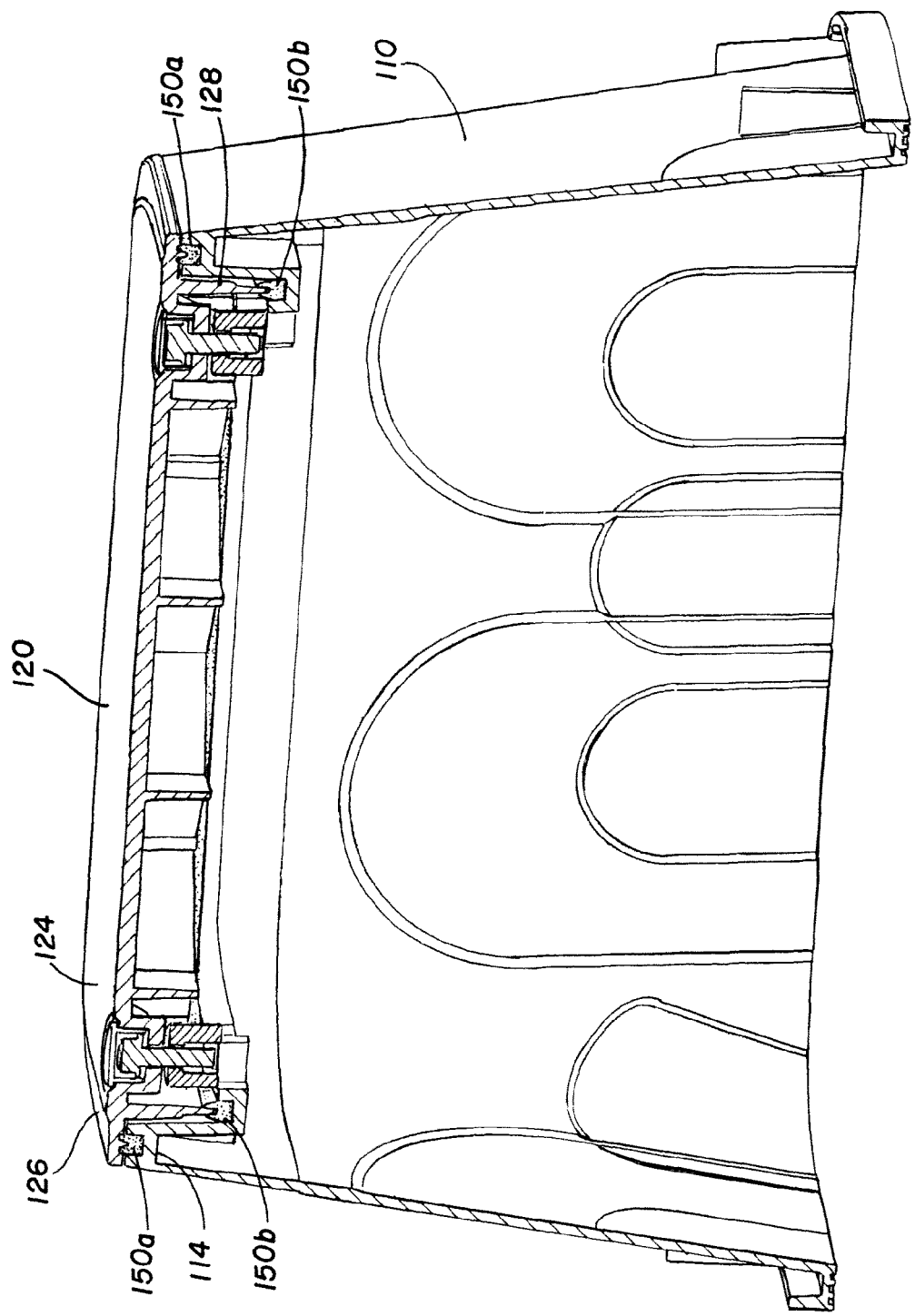
FIG. 3 a cross sectional view of an underground utility box in accordance with an embodiment of the present disclosure.
Figure 4:
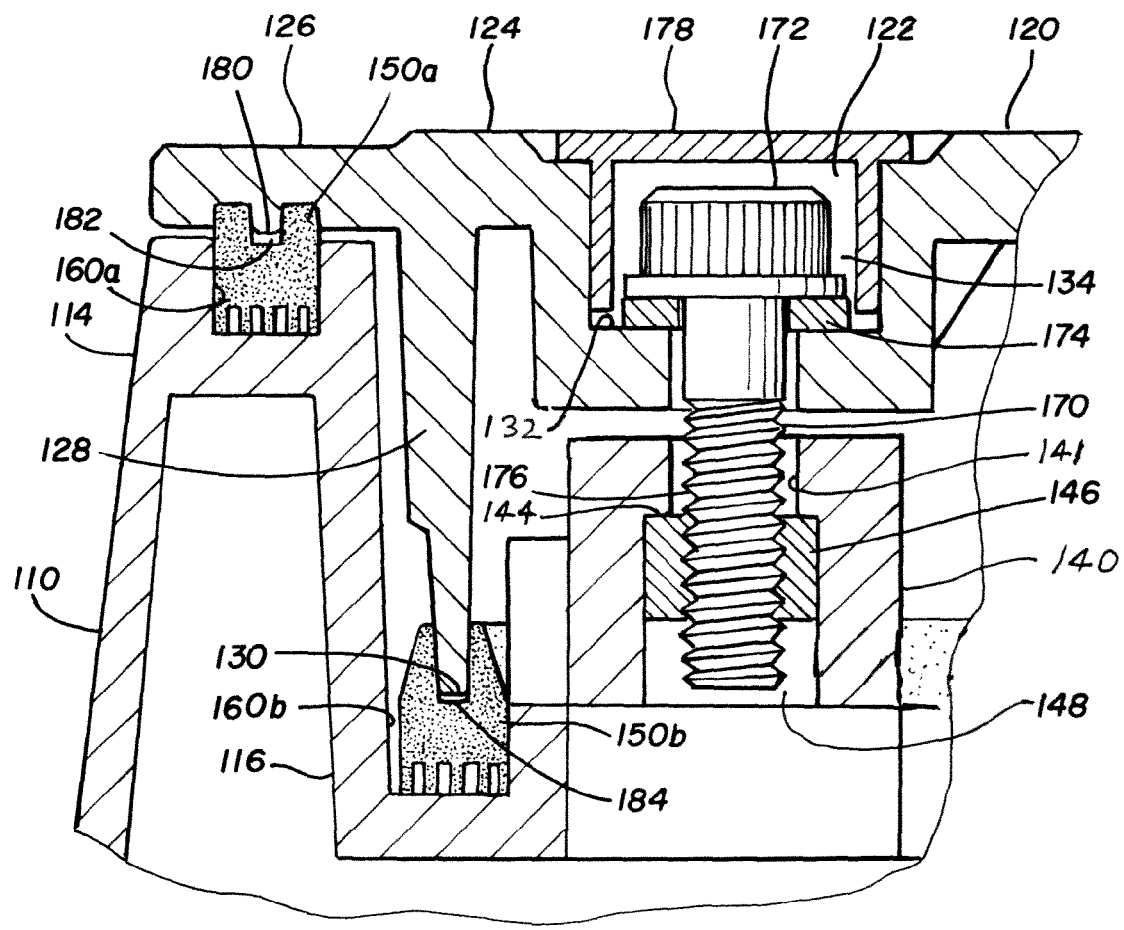
FIG. 4 is a detail view of a portion of an underground utility box in accordance with an embodiment of the present disclosure.

Referring to FIGS. 3 and 4, the cover 120 is advantageously configured to include a central portion 124 in which the cover apertures 122 are located, and an outer peripheral portion or frame 126. The central portion is 124 is configured to cover the open upper end 112 of the housing, while the frame 126 is configured to seat against the vertical rim 114 of the housing 110. A peripheral vertical flange 128 extends downward from the bottom (interior) surface of the cover 120 approximately at the juncture of the central portion 124 and the frame 126 of the cover 120. The flange 128, which is dimensioned to fit into the open upper end 112 of the housing structure, inward from the peripheral rim 114 thereof, terminates in a bottom edge 130. As will be explained below, when the cover 120 is installed on the housing structure 110, the underside of the cover frame 126 engages against the first sealing element 150a, while the bottom edge 130 of the vertical flange 128 engages against the second seating element 150b.

The housing structure 110 and the cover 120 may be constructed of a durable, weather-resistant material that is capable of withstanding prolonged outdoor exposure. Plastics are preferred since they do not corrode and are typically lightweight. Examples of preferred materials include high-density polyethylene (HDPE) or UV-stabilized polyvinyl chloride (UV-PVC), with HDPE being preferred.

FIG. 3 is a cross-sectional view of the assembled utility box 100, as viewed along the section line 3-3 in FIG. 1. FIG. 4 is a detailed view of the portion encompassed by the circle 4-4 in FIG. 3. Referring to FIG. 4, the first cover aperture 122 passes through the cover 120 and extends to a recessed interior annular seat 132 formed on the underside of the cover 120. The seat 132 restricts the vertical movement of the fastener 170 relative to the cover 120. The bore 141 of the first fastener receptacle is dimensioned to receive the fastener 170, and it advantageously includes an annular seat 144 that is configured to hold, in a fixed position, a nut 146 or the like to secure the fastener 170. The fastener 170 and the nut 146 comprise a fastening assembly that may be used to secure the cover 120 to the housing structure 110, compressing the sealing elements 150a, 150b between them as will be described below. It is understood that the housing structure 110 and the cover 120 have structure corresponding to that which is illustrated in FIG. 4 and described herein encompassing the second fastener receptacle 140 and the second cover aperture 122.

More specifically, each of the fastener receptacle bores 141 includes an enlarged-diameter lower portion 148 that defines the annular seat 144. Each of the cover apertures 122 includes an enlarged-diameter upper portion 134 that defines the annular seat 132 in the cover 120. In some embodiments, the nut 146 may be co-molded with the housing structure 110. Alternatively, the fastener receptacle bores 141 themselves may be internally threaded to secure the fasteners 170, thereby eliminating the need for the nuts 146.

The upper portion 134 of each of the cover apertures 122 receives the head 172 of a fastener 170 (and, optionally, a washer 174), so that the fastener head 172 engages the seat 132. The shank 176 of the fastener 170 thereby extends past the annular seat 132, through the bore 141 of the fastener receptacle 140, and into the lower portion 148 thereof for engagement with the nut 146. Accordingly, when the fasteners 170 are tightened into their respective nuts 146, the heads 172 of the fasteners 170 bear against their respective annular seats 132. As shown in FIG. 2, a cap 178 may be inserted into each of the cover apertures 122 to cover the heads of the fasteners 170, thereby reducing the ability of dirt, sand, and other debris to enter the utility box.

When the cover 120 is placed on top of the housing structure 110 with the sealing elements or gaskets 150a, 150b seated within seating channels 160a 160b, respectively, the sealing elements or gaskets 150a, 150b are sandwiched between the cover 120 and the housing structure 110. Specifically, the underside of the peripheral frame 126 of the cover 120 bears against and provides a sealing engagement with the first sealing element or gasket 150a, and the lower edge 130 of the peripheral vertical flange 128 bears against and provides a sealing engagement with the second sealing element or gasket 150b. The sealing engagement between the cover frame 126 and the first sealing element or gasket 150a may be enhanced by providing the underside of the cover frame 126 with a downwardly extending peripheral lip 180 that is received in a corresponding groove or slot 182 in the first sealing element or gasket 150a. Likewise, the sealing engagement between the flange 128 and the second sealing element or gasket 150b may be enhanced by providing the second sealing element 150b with a groove or slot 184 that receives the flange 128. The sealing engagement between the frame 126 and the first sealing element 150a, and between the flange 128 and the second sealing element 150b, provide first and second liquid-tight seals between the cover 120 and the housing structure 110. Thus, in the illustrative embodiment, the utility box is advantageously configured with a double seal, thereby providing additional protection for the contents of the utility box.

The housing structure 110 and the cover 120 are configured such that when the cover 120 is initially placed on the housing structure 110, the sealing elements 150a, 150b are spaced slightly from, or bear lightly against, their respective seating channels 160a, 160b. When the fasteners 170 is tightened into their respective nuts 146 (FIG. 4), the sealing elements or gaskets 150a, 150b are squeezed respectively between the peripheral frame portion 126 of the cover 120 and the channel 160a, and between the flange 128 and the channel 160b. The squeezing forces the elastomeric material of the sealing elements or gaskets 150a, 150b to bulge outwardly, forming a seal at each of the seating channels 160a and 160b that resists entry of water, dust, debris, rodents, spiders, etc. into the interior of the utility box assembly 100.

The following description recites a method of securing the cover 120 to a housing structure 110 to form a utility box assembly in accordance with aspects of the present invention. With the housing structure 110 uncovered, the operator begins with the cover 120 in a state in which the fasteners 170 are withdrawn. The operator then positions the cover 120 in the open upper end 112 of the housing structure 110 so that the peripheral frame 126 of the cover rests on the peripheral rim 114 of the housing structure 110, with the fasteners 170 in the cover apertures 122a, 122b and aligned with the body apertures 140a, 140b. In this configuration, the sealing elements or gaskets 150a, 150b are positioned in their respective seating channels 160a, 160b, and the vertical peripheral flange 128 on the bottom or inner surface of the cover 120 is positioned inside the open upper end 112 of the housing structure 110. The operator next tightens the fasteners into the nuts 146. As the fasteners are tightened, the sealing elements or gaskets 150a, 150b are compressed between the cover 120 and housing structure 110, thereby causing the sealing elements or gaskets 150a, 150b to bulge outwardly against the surfaces defining their respective channels 160a, 160b to create liquid tight seals at the seating channels 160a and 160b.

The above description presents the best mode contemplated for carrying out the present utility box assembly, and of the manner and process of making and using it, in such full, clear, concise, and exact terms as to enable any person skilled in the art to which it pertains to make and use this utility box assembly. This utility box assembly is, however, susceptible to modifications and alternate constructions from that discussed above that are fully equivalent. Consequently, this disclosure is not limited to the particular embodiments described and illustrated herein. On the contrary, this disclosure encompasses all modifications and alternate constructions coming within the spirit and scope of the following claims, which particularly point out and distinctly claim the subject matter of this disclosure.

What is claimed is:

1. A utility box assembly comprising:
   a housing having an open upper end, a first peripheral channel around the open upper end, and a second peripheral channel around the open upper end and disposed below the first peripheral channel and inwardly therefrom, wherein the housing comprises a plurality of walls defining a peripheral interior wall surface, and wherein the second peripheral channel is defined along the peripheral interior wall surface;
   a first sealing element seated in the first peripheral channel;
   a second sealing element seated in the second peripheral channel; and
   a cover configured to be secured to the housing so as to cover the open upper end and to provide a sealing engagement with the first and second sealing elements, wherein the cover has an outer peripheral portion configured to engage the first sealing element and a downward-depending flange configured to engage the second sealing element.

2. The utility box assembly of claim 1, wherein the first sealing element and the second sealing element are formed from a resilient, elastomeric material.

3. The utility box assembly of claim 1, further including a fastening assembly configured to secure the cover and the housing together with the first and second sealing elements each being in engagement between the cover and the housing.

4. A utility box assembly comprising:
   a housing structure having an open upper end configured with first and second peripheral channels surrounding the open upper end of the housing structure, the second peripheral channel being positioned below and inwardly from the first channel in the housing structure, wherein the housing structure includes a peripheral rim and a plurality of walls defining a peripheral interior wall surface, wherein the first peripheral channel is defined in the peripheral rim, and wherein the second peripheral channel is defined along the peripheral interior wall surface;
   a first sealing element seated in the first peripheral channel and a second sealing element seated in the second peripheral channel; and
   a cover configured to be received in the open upper end of the housing structure so as to cover the open upper end of the housing structure while engaging and bearing against each of the first and second sealing elements.

5. The utility box assembly of claim 4, further including a fastening assembly configured to secure the cover and the housing structure together with the first and second sealing elements sandwiched in between.

6. The utility box assembly of claim 4, wherein the first and second sealing elements are formed from a resilient, elastomeric material.

7. The utility box assembly of claim 4, wherein the cover includes a downwardly-extending peripheral flange that is configured to be received through the open upper end of the housing structure and to bear against the second sealing element when the cover is received in the open upper end of the housing structure.

8. The utility box assembly of claim 4, wherein the cover includes a peripheral frame portion configured to seat on the peripheral rim so as to engage the first sealing element when the cover is received in the open upper end of the housing.

* * * * *